(12) United States Patent
Sheu

(10) Patent No.: US 6,507,800 B1
(45) Date of Patent: Jan. 14, 2003

(54) METHOD FOR TESTING SEMICONDUCTOR WAFERS

(75) Inventor: Shiow-Hwan Sheu, Hsinchu (TW)

(73) Assignee: Promos Technologies, Inc., Hsinchu (TW)

(*) Notice: Subject to any disclaimer, the term of this patent is extended or adjusted under 35 U.S.C. 154(b) by 0 days.

(21) Appl. No.: 09/524,182

(22) Filed: Mar. 13, 2000

(51) Int. Cl.[7] .............................................. G01R 31/14
(52) U.S. Cl. ........................ 702/117; 702/118; 702/35
(58) Field of Search ................... 702/117–119, 33–36, 702/40, 58, 59, 64, 65, 81–84, 123, 124, 129, 183, 185, 188, FOR 103, FOR 104, FOR 106, FOR 123, FOR 125, FOR 134, FOR 137, FOR 139, FOR 170, FOR 171; 324/763, 73.1; 438/14, 15, 17, 18, 10; 700/109, 110, 121; 706/904, 908, 912, 916; 382/141, 145, 149; 345/419

(56) References Cited

U.S. PATENT DOCUMENTS 5,450,326 A * 9/1995 Black ........................ 345/419
5,991,699 A * 11/1999 Kulkarni et al. ............. 438/10
6,289,292 B1 * 9/2001 Charlton et al. ............ 702/108
6,336,086 B1 * 1/2002 Perez et al. ................. 382/141

* cited by examiner

Primary Examiner—Hal Wachsman
(74) Attorney, Agent, or Firm—Blakely Sokoloff Taylor & Zafman

(57) ABSTRACT

A method for identifying failure signatures of semiconductor wafers is disclosed. Testing for obtaining a first set of test data indicative of a failure signature is performed on a number of wafers having circuit patterns thereon. The test data is divided into a first subset of test data associated with a failure signature and a second subset of test data not associated with the failure signature. The set of test data is used to generate coefficients of a discriminant function. Testing is performed on a subsequently manufactured wafer to obtain a second set of test data. The discriminant function is applied to the second set of test data to obtain a discriminant value, and the wafer is identified as having the failure signature when the discriminant value is greater than or equal to a threshold value.

20 Claims, 3 Drawing Sheets

METHOD FOR TESTING SEMICONDUCTOR WAFERS

FIELD OF THE INVENTION

This invention relates to semiconductor processing, and more particularly, to an improved method of classifying semiconductor wafers according to particular characteristics.

BACKGROUND OF THE INVENTION

Semiconductor wafer fabrication involves complex manufacturing processes to produce integrated circuits on the surface of silicon wafers. To ensure the quality of the integrated circuit chips, various testing methods have been devised to find defects on the wafer in order to improve the manufacturing processes. One method is to place testing circuitry at various locations on the wafer, and use test signals to determine the functionality of the circuitry. The resulting test data is then used to generate defect patterns. Typically, an experienced engineer then analyzes the defect patterns and determines the root cause of the defects. For example, a defect pattern having curvilinear features may resemble a mechanical scratch; the grouping of low-density, sparse structures into amorphous clusters might resemble the trail off of a teardrop shaped stain.

During the initial run of a semiconductor wafer production line, electrical testing is conducted on each wafer manufactured, and the defect patterns of the wafer are used to produce a set of standard defect wafer maps. Each defect wafer map corresponds to a particular kind of defect pattern, and different defect wafer maps may be linked to different problems in the manufacturing process. After the set of standard defect wafer maps are generated, the defect pattern obtained from a subsequently manufactured wafer can be compared against the standard defect wafer maps to determine the cause of the defects.

Manually comparing the defect patterns with the standard defect wafer maps can be a tedious and time-consuming work. As the number of wafers manufactured is increased, it is feasible to have an automated process for performing the pattern recognition. However, when there is more than one defect in the manufacturing process, the defect patterns caused by the various defective processes may overlap, producing an obscured defect pattern. This may result in incorrect determination of the cause of the defect, lengthening the time required to perfect the manufacturing process.

The present invention is directed to an improved method for failure mode classification of semiconductor wafers using discriminant analysis and cluster analysis.

SUMMARY OF THE INVENTION

A method for identifying failure signatures of semiconductor wafers is disclosed. The method includes the steps of providing a number of wafers having circuit patterns; testing each of the wafers to obtain a first set of test data, the first set of test data including a first subset of test data obtained from wafers associated with a failure signature and a second subset of test data obtained from wafers not associated with the failure signature; generating coefficients for a discriminant function; performing tests on a subsequently manufactured wafer to obtain a second set of test data, applying the discriminant function to the second set of test data to obtain a discriminant value, and identifying the subsequently manufactured wafer as having the failure signature when the discriminant value is greater than or equal to a threshold value.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
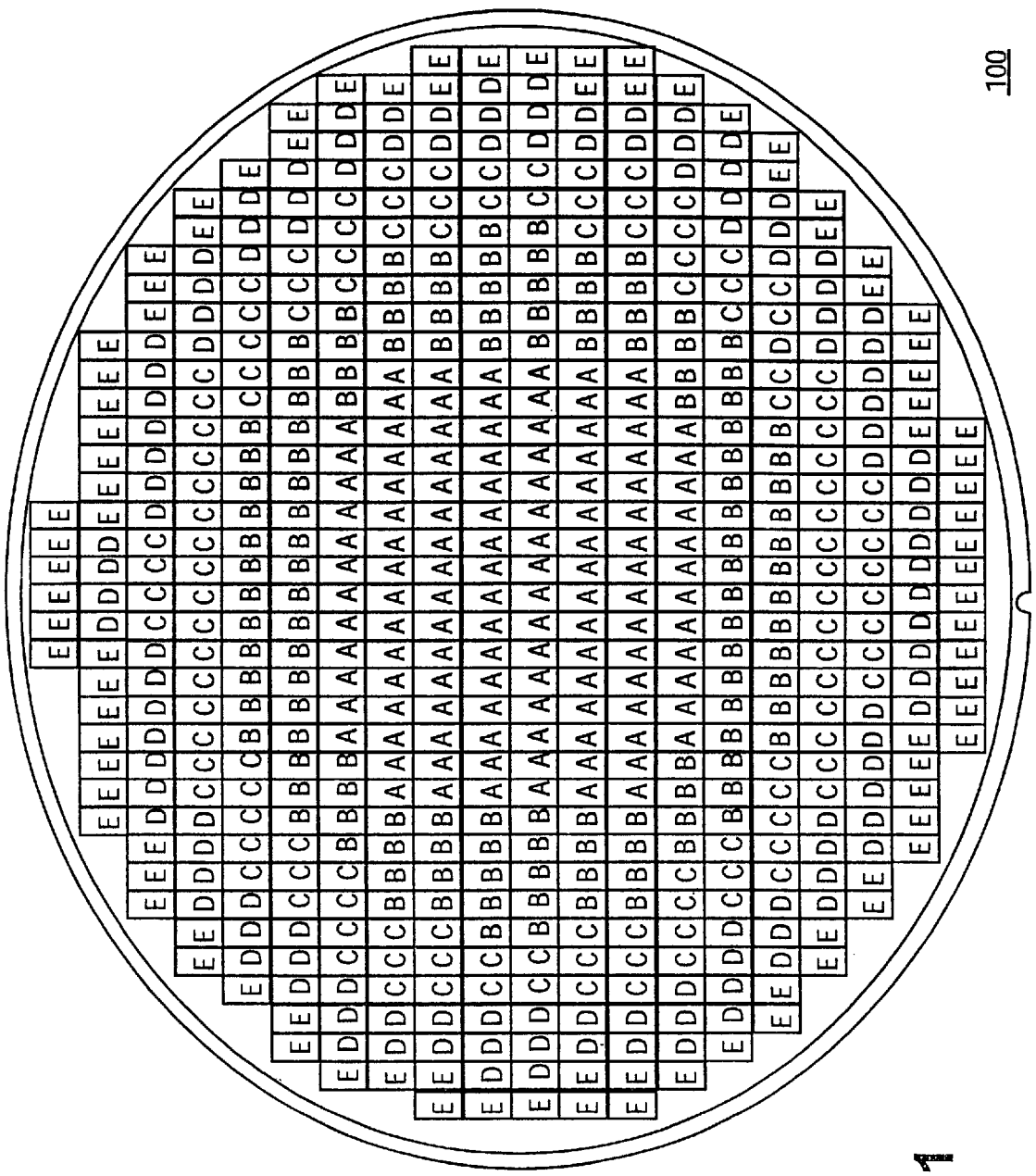
FIG. 1 is a representative map of a wafer divided into several concentric regions.

This invention uses discriminant analysis to classify defective wafers according to failure signatures, and thereby determine the yield loss and cause of defect. An initial set of wafers is produced as training samples. A series of electrical and/or physical tests are performed on the wafers to generate a set of training test data. For example, the tests might include testing the threshold voltage of devices, testing the contact resistance of two metal lines, testing the yield rate of different regions on the wafer, testing the yield rate of different wafers in the same bin, etc. The data from various tests can be combined to show a characteristic pattern that is indicative of a defect in a particular processing tool or processing step. For example, threshold voltage test data and regional yield test data may be combined to indicate a characteristic pattern indicating that the threshold voltage is lower than specification, and there might be some problems with deep trench process. Such a characteristic pattern is called a failure signature. A name, such as "VT Node Low", may be assigned to the failure signature for identification purposes.

The defective wafers in the initial set of wafers may have more than one kind of characteristic defect patters. An operator may manually classify the defective wafers into different groups according to their characteristic defect pattern, and assign a failure signature to each group. The operator may also employ cluster analysis to classify the defective wafers into different groups, and assign a fail signature to each group. The cluster analysis may be performed with the aid of a computer.

For each type of failure signature, the initial set of wafers is divided into a first group having a failure signature, and a second group without the failure signature. Likewise, the training test data is divided into two groups, a first subset of training test data associated with the wafers that have the failure signature, and a second subset of training test data associated with wafers that do not have the failure signature. Using the first and second subset of training test data, the coefficients of a linear discriminant function can be generated according to classificatory discriminant analysis. A discriminant function takes a set of test data as input, and gives as output a number that indicates the likelihood that the set of test data corresponds to a particular failure signature.

After the discriminant functions for every failure signature are determined, the coefficients of these discriminant functions are stored in a database. Afterwards, when a wafer is produced, the wafer goes through a series of electrical and/or physical tests, and the test data is sent to a computer implementing the discriminant analysis. The coefficients of the discriminant functions are retrieved from the database, the test data value is used as input to the discriminant function, and an output discriminant value is generated indicative of whether the wafer has a particular failure signature. The discriminant function for each failure signature is applied to the test data to determine what types of failure signatures the wafer has. In this way, the wafers can be classified according to failure signatures swiftly, and various causes of the defects on newly produced wafers can be determined in an efficient manner.

Discriminant Analysis

For purpose of illustration, assume that n different parameters $P_1, P_2, \ldots,$ and $P_n$, that can be obtained from a wafer by using various electrical and physical testing methods. Furthermore, assume that the n different parameters are related to the determination of p different failure signatures. These parameters are indicative of the failure signature, i.e., whether a wafer has a failure signature can be determined by examining these parameters. Each failure signature may indicate a particular fault in the manufacturing process. The discriminant function of a failure signature can be represented as a linear combination of the parameters $P_1$ to $P_n$:

$$Y(P)=a+B_1P_1+B_2P_2+B_3P_3+\ldots+B_nP_n \quad \text{(Equ. 1)}$$

Here, $P=(P_1, P_2, \ldots, P_n)$, the symbol "a" represents a constant, and symbols "$B_1$" to "$B_n$" represent coefficients of the parameters $P_1$ to $P_n$. The symbols "a", "$B_1$" to "$B_n$" represent the coefficients of the discriminant function. The coefficients $B_1$, to $B_n$ are also called liner transformation vector coefficients. When a set of test data for parameters $P_1$ to $P_n$ for a new wafer is obtained, the test data values are substituted for $P_1$ to $P_n$ in Equation 1 for calculating the discriminant value Y. If the value Y is above a predetermined threshold value, then the wafer has the failure signature that corresponds to the discriminant function Y(P). For different failure signatures, the coefficients for the corresponding discriminant functions are different. When there are p failure signatures, there is p correponding discriminant functions.

Different failure signatures may be associated with different test parameters. For example, the discriminant function $Y_1(P)$ for a first failure signature may be related to parameters $P_1, P_2$, and $P_3$. In this case, the coefficients $B_4, B_5, \ldots, B_n$ equal to zero. As another example, the discriminant function $Y_2(P)$ for a second failure signature may be related only to parameters $P_3, P_5$ and $P_6$. Then the coefficients $B_1, B_2, B_4, B_7, B_8, \ldots, B_n$ are equal to zero. Typically, all of the parameters of a wafer are measured and stored in a database. Later, test data related to different parameters are retrieved as needed.

The coefficients of the discriminant function Y(P) in Equation 1 is derived from a set of training test data that are measurements (or tests) of the parameters $P_1$ to $P_n$ obtained from an initial set of wafers. The initial set of wafers includes a first subset of wafers (denoted as "$\pi 1$") that are associated with a failure signature, and a second subset of wafers (denoted as "$\pi 2$") that are not associated with the failure signature. For purpose of illustration, assume a measurement of parameters $P_1$ to $P_n$ of a wafer is in the form:

$$X=[x_1 x_2 \ldots x_n]$$

The discriminant function Y(X) transforms the multivariate measurement values X to a univariate value Y, such that the Y values derived from $\pi 1$ and $\pi 2$ are as far separated as possible. The univariate value Y is the discriminant value. Hereinafter, the symbol "Y( )" refers to the discriminant function, and the symbol "Y" refers to the discriminant value. Define $\mu_{1Y}$ as the mean value of Y calculated by applying the discriminant function to measurement values (or test data values) derived from $\pi 1$. Define $\mu_{2Y}$ as the mean value of Y calculated by applying the discriminant function to measurement values (or test data values) derived from $\pi 2$. The coefficients of the discriminant function Y(P) is designed to achieve a maximum square distance between $\mu_{1Y}$ and $\mu_{2Y}$.

The following describes the method of generating the coefficients of the discriminant function Y(X) when the measurement values (test values) are written as vector X. Define $\mu_1 = E(X|\pi_1)$ as the expected value vector of a multivariate measurement of wafers in $\pi_1$. Define $\mu_2 = E(X|\pi_2)$ as the expected value vector of a multivariate measurement of wafers in $\pi_2$. A covariance matrix $\Sigma$ is calculated as:

$$\Sigma=E(X-\mu_i)(X-\mu_i)', i=1,2$$

The discriminant value Y is a linear combination of the measurement values X, and is calculated as:

$$Y=l'\cdot X,$$

Here, Y is a (1×1) number, l is a (1×n) vector, X is a (n×1) vector, and the symbol "·" represents matrix multiplication. The symbol "l" represents a best estimator vector, and will be further described below. The mean values $\mu_{1Y}$ and $\mu_{2Y}$ are calculated as:

$$\mu_{1Y}=E(Y|\pi_1)=E(l'\cdot X|\pi_1)=l'\mu_1$$

$$\mu_{2Y}=E(Y|\pi_2)=E(l'\cdot X|\pi_2)=l'\mu_2$$

The variance matrix is calculated as:

$$VAR(Y)=VAR(l'\cdot X)=l'\cdot\Sigma\cdot l$$

The following formula is used to calculate the best estimator vector l that maximizes the ratio of "the squared distance between mean values of Y" and "variance of Y". The best estimator l is calculated as:

$$l=\Sigma^{-1}\cdot(\mu_1-\mu_2)$$

Thus the discriminant value Y is calculated as:

$$Y=l'\cdot X=(\mu_1-\mu_2)'\cdot\Sigma^{-1}\cdot X \quad \text{(Equ. 2)}$$

The above Equation 2 shows how a discriminant value Y is obtained from the measurement values X that are obtained from the initial set of wafers. Equation 2 also shows how the coefficients of a discriminant function Y(X) is obtained by expanding the term $(\mu_1-\mu_2)'\cdot\Sigma^{-1}$. The initial set of wafers includes a first subset of wafers ($\pi 1$) that are associated with a failure signature, and a second subset of wafers ($\pi 2$) that are not associated with the failure signature.

After the vectors $\mu_1$ and $\mu_2$, and matrix $\Sigma$ are calculated, the discriminant function Y(X) is used to determine whether a new wafer has the failure signature using the method described below. For purpose of illustration, assume a measurement (or test) is performed on a new wafer, and $X_0$ is the measurement data (or test data). The discriminant value $Y_0$ is obtained from Equation 2 described above. A midpoint value m between mean values of measurements obtained from wafers in $\pi_1$ and $\pi_2$ is:

$$m=1/2(\mu_{1Y}+\mu_{2Y})=1/2(l'\mu_1+l'\mu_2)=1/2(\mu_1-\mu_2)'\Sigma^{-1}(\mu_1+\mu_2) \quad \text{(Equ. 3)}$$

The new wafer is determined to have the failure signature (or associated with the failure signature) if $$y_0 - m \geq 0$$

and the new wafer is determined not to have the failure signature (or not associated with the failure signature) if $$y_0 - m < 0.$$

Turning to FIG. 1, in one embodiment of the invention, a wafer is conceptually divided into five concentric regions A, B, C, D, and E. A first set of wafers produced from a semiconductor fabrication plant is used as a training set. The first set of wafers are tested for the parameters $P_1$="Direct Current Yield", $P_2$="Functional Test Yield", $P_3$="Final Yield", $P_4$="Region A Functional Yield", $P_5$="Region B Functional Yield", and $P_6$="Region C Functional Yield", $P_7$="Region D Functional Yield", and $P_8$="Region E Functional Yield". These parameters are related to the "Threshold Voltage Node Low (VT Node Low)" failure signature. The test data may be obtained by probing various testing points on the wafers. The test data values may be represented as a matrix X, with each column $X_i$ (i is the column number) having the form:

$$X_i = [P_1 P_2 P_3 P_4 P_5 P_6 P_7 P_8] \quad \text{(Equ. 4)}$$

An operator manually classifies the first set of wafers into two subsets by inspecting the data: a first subset of wafers having the "VT Node Low" failure signature, and a second subset of wafers without the "VT Node Low" failure signature. The operator may also employ a computer applying cluster analysis on the test data to classify the wafers into a first subset of wafers having the "VT Node Low" failure signature, and a second subset of wafers without the "VT Node Low" failure signature.

The test data values obtained from the first subset of wafers are grouped together in a matrix $X_1$. The number of columns ($n_1$) in matrix $X_1$ is the same as the number of wafers having the "VT Node Low" failure signature. The number of rows (n) in matrix $X_1$ is the same as the number of parameters (8 in the above example). Hence, the matrix $X_1$ is expressed as:

$$X_1 = [x_{1,1} x_{1,2} \ldots x_{1,n1}]$$

where $x_{1,1}, x_{1,2}, \ldots, x_{1,n1}$ are (n×1) matrices. The test data values obtained from the second subset of wafers are grouped together in a matrix $X_2$. The number of columns ($n_2$) in matrix $X_2$ is the same as the number of wafers without the "VT Node Low" failure signature. The number of rows in matrix $X_2$ is the same as the number rows in $X_1$. Hence, the matrix $X_2$ is expressed as:

$$X_2 = [x_{2,1} x_{2,2} \ldots x_{2,n1}]$$

where $x_{2,1}, x_{2,2}, \ldots, x_{2,n1}$ are (n×1) matrices. Thus, the test data values from the first set of wafers (including the first and second subset of wafers) are represented in matrix form:

$$X = [X_1 X_2].$$

From the data matrices $X_1$ and $X_2$, the sample mean vector matrices ($\overline{X_1}$ and $\overline{X_2}$) and covariance matrices ($S_1$ and $S_2$) are determined by the following equations:

$$\overline{x}_1 = \frac{1}{n_1} \sum_{j=1}^{n_1} x_{1j};$$

$$S_1 = \frac{1}{n_1 - 1} \sum_{j=1}^{n_1} (x_{1j} - \overline{x}_1)(x_{1j} - \overline{x}_1)'$$

$$\overline{x}_2 = \frac{1}{n_2 - 1} \sum_{j=1}^{n_2} x_{2j};$$

$$S_2 = \frac{1}{n_2 - 1} \sum_{j=1}^{n_2} (x_{2j} - \overline{x}_2)(x_{2j} - \overline{x}_2)'$$

$$S_{pooled} = \left[ \frac{n_1 - 1}{(n_1 - 1) + (n_2 - 1)} \right] S_1 + \left[ \frac{n_2 - 1}{(n_1 - 1) + (n_2 - 1)} \right] S_2$$

Here, $\overline{X_1}$ and $\overline{X_2}$ are (p×1) vectors. Applying linear discriminant analysis, the discriminant value y is computed from x:

$$y = \hat{l}'x = (\overline{x}_1 - \overline{x}_2)' S^{-1} x$$

The midpoint value $\hat{m}$ between the two univariate mean values ($\overline{y}_{w/}$ and $\overline{y}_{w/o}$) is given by:

$$\hat{m} = \frac{1}{2}(\overline{y}_{wl} + \overline{y}_{wlo}) = \frac{1}{2}(\overline{x}_1 - \overline{x}_2)' S_{pooled}^{-1} (\overline{x}_1 + \overline{x}_2)$$

where, $$\overline{y}_{wl} = \frac{1}{n_1} \sum_{i=1}^{n_1} l' x_{1i} = \frac{1}{n_1} \sum_{i=1}^{n_1} y_i; \quad i = 1, \ldots, n_1 \text{ measurement}$$

$$\overline{y}_{wlo} = \frac{1}{n_2} \sum_{i=1}^{n_2} l' x_{2i} = \frac{1}{n_2} \sum_{i=1}^{n_2} y_i; \quad i = 1, \ldots, n_2 \text{ measurement}$$

The mean value $\overline{y}_{w/}$ is the mean value for measurements (or test data) obtained from the first subset of wafers with the failure signature, and the mean value $\overline{y}_{w/o}$ is the mean value for measurements (or test data) obtained from the second subset of wafers without the failure signature.

After the midpoint value $\hat{m}$ has been determined, whether a new wafer has the failure signature can be easily determined by using the discriminant function Y(X) and the midpoint value $\hat{m}$. The measurement data X from the new wafer is used as input to the discriminant function Y(X) to generate the discriminant value Y. The discriminant value Y is compared against the midpoint value $\hat{m}$. If Y ≥ $\hat{m}$, then the new wafer has the failure signature "VT Node Low"; and if Y < $\hat{m}$, then the wafer does not have the failure signature "VT Node Low". In this way, a newly produced wafer can be classified according to whether it has the failure signature in an efficient manner. This method can also be applied to determining whether the wafer has other failure signatures.

The electrical tests and discriminant function given above are for purpose of illustration only. Other electrical and/or physicals tests may also be performed on the wafers in relation to different failure signatures. For example, electrical tests may include "regional yield for each bin", "regional classify pattern regulation", "absolute bin data", "relative bin data", "defect data", and "wafer acceptance test", etc. The wafer may also be conceptually divided into more than five concentric regions, or divided into pie sections, etc., according to different applications.

Wafer Testing

Figure 2:
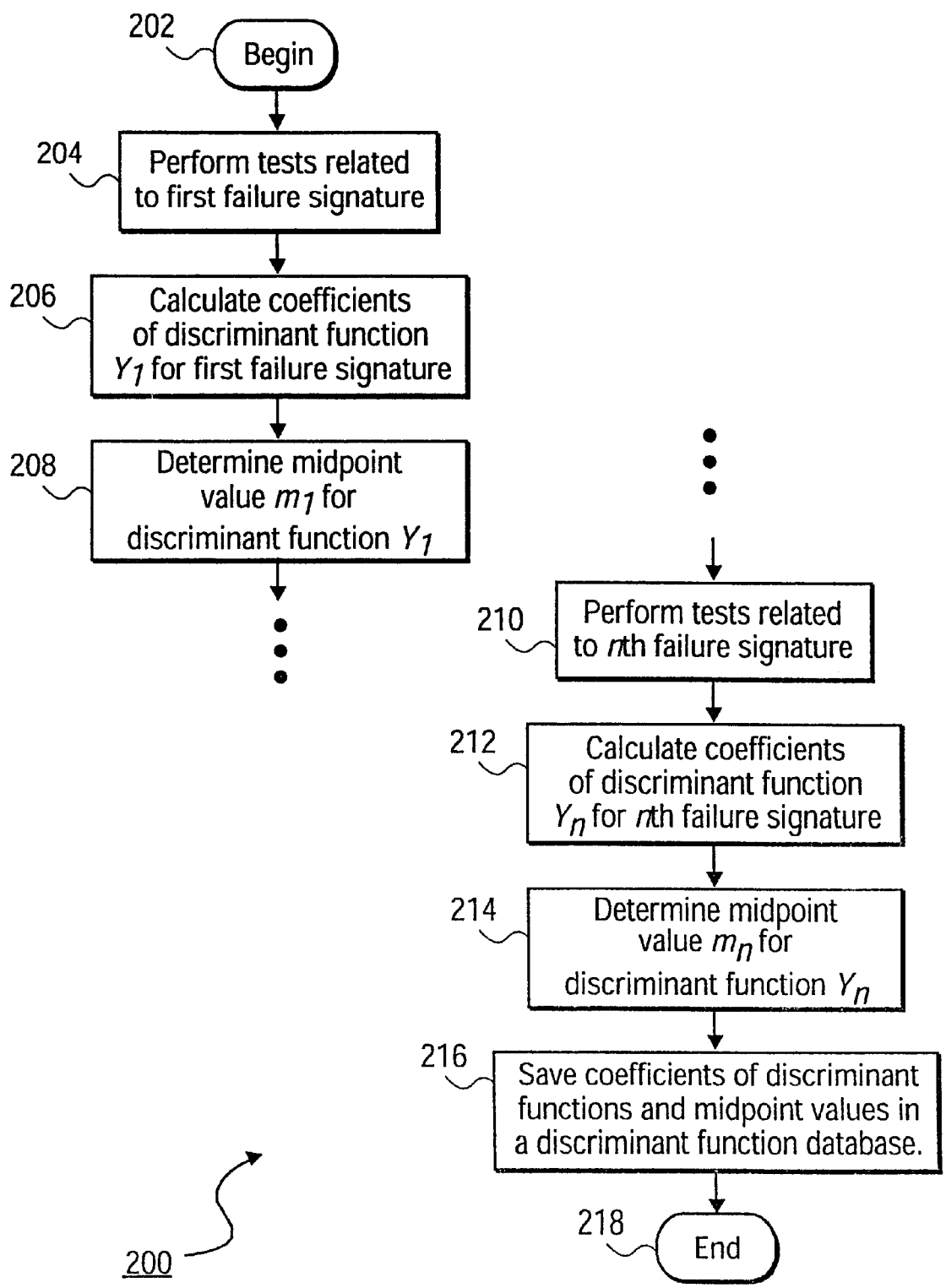
FIG. 2 is a flow diagram of a process for determining the discriminant functions.

Turning to FIG. 2, process flow 200 is used to determine the discriminant functions $Y_1$ to $Y_n$ for n failure signatures.

For example, a failure signature may be the "VT Node Low" failure signature. Other examples of failure signatures are "VF Center Spot" and "MO Over Polish" failure signatures, etc. Each failure signature may be associated with several electrical and/or physical tests. Process 200 begins in box 202. In box 204, the electrical and/or physical testing related to the first failure signature is performed. Several parameters may have to be tested throughout the various testing points on the wafer. For example, the parameters "Direct Current Yield", "Functional Test Yield", "Final Yield", "Region A Functional Yield", "Region B Functional Yield", and "Region C Functional Yield", "Region D Functional Yield", and "Region E Functional Yield" may have to be tested.

In box 206, the coefficients of the discriminant function $Y_1$ are calculated. The coefficients for $Y_1$ may be calculated in accordance to Equation 2. In box 208, the midpoint value $m_1$ for discriminant function $Y_1$ is determined according to Equation 3. The discriminant functions and midpoint values for the second to the (n−1)th failure signatures are then calculated (not shown in the figure). In box 210, the electrical and/or physical testing for the nth failure signature is performed. Several parameters may have to be tested throughout the various testing points on the wafer in relation to the nth failure signature. These parameters may be different from the parameters associated with the first failure signature tested in box 204. In box 212, the coefficients of discriminant function $Y_n$ are calculated. The coefficients for $Y_n$ may be calculated in a similar method as in Equation 2. In box 214, the midpoint value $m_n$ for discriminant function $Y_n$ is determined in a similar method as Equation 3. In box 216, the coefficients of the discriminant functions coefficients of the discriminant functions $Y_1$ to $Y_n$ and the midpoint values $m_1$ to $m_n$ are saved in a discriminant function database. The process 200 then ends in box 218.

In the above embodiment, tests related to each failure signature are tested before the coefficients for the corresponding discriminant functions are calculated. The tests can also be performed all in one step, and have the test data stored in a database. For example, 100 different tests can be performed on the wafers to obtain test data related to 100 different parameters. Suppose a particular failure signature is related to only 20 parameters. Then in determining the discriminant function that corresponds to that failure signature, only the test data related to that 20 parameters are retrieved and used in equations for calculating the discriminant function coefficients.

In one embodiment of the invention, the wafers produced during the first week of production may be used to establish a set of discriminant functions and midpoint values. A typical wafer production line may be associated with more than 20 types of failure signatures. When wafers are produced in the second week, these wafers are tested, and the discriminant functions are applied to determine whether these wafers contain a particular failure signature. If a wafer has no or few defects, then it may pass as a good high yield wafer. If a wafer has numerous defects, then the cause of the defects can be determined efficiently according to the failure signature as determined by the discriminant function. The test data obtained during the second week may be used as a training set to refine the coefficients of the discriminant functions.

Figure 3:
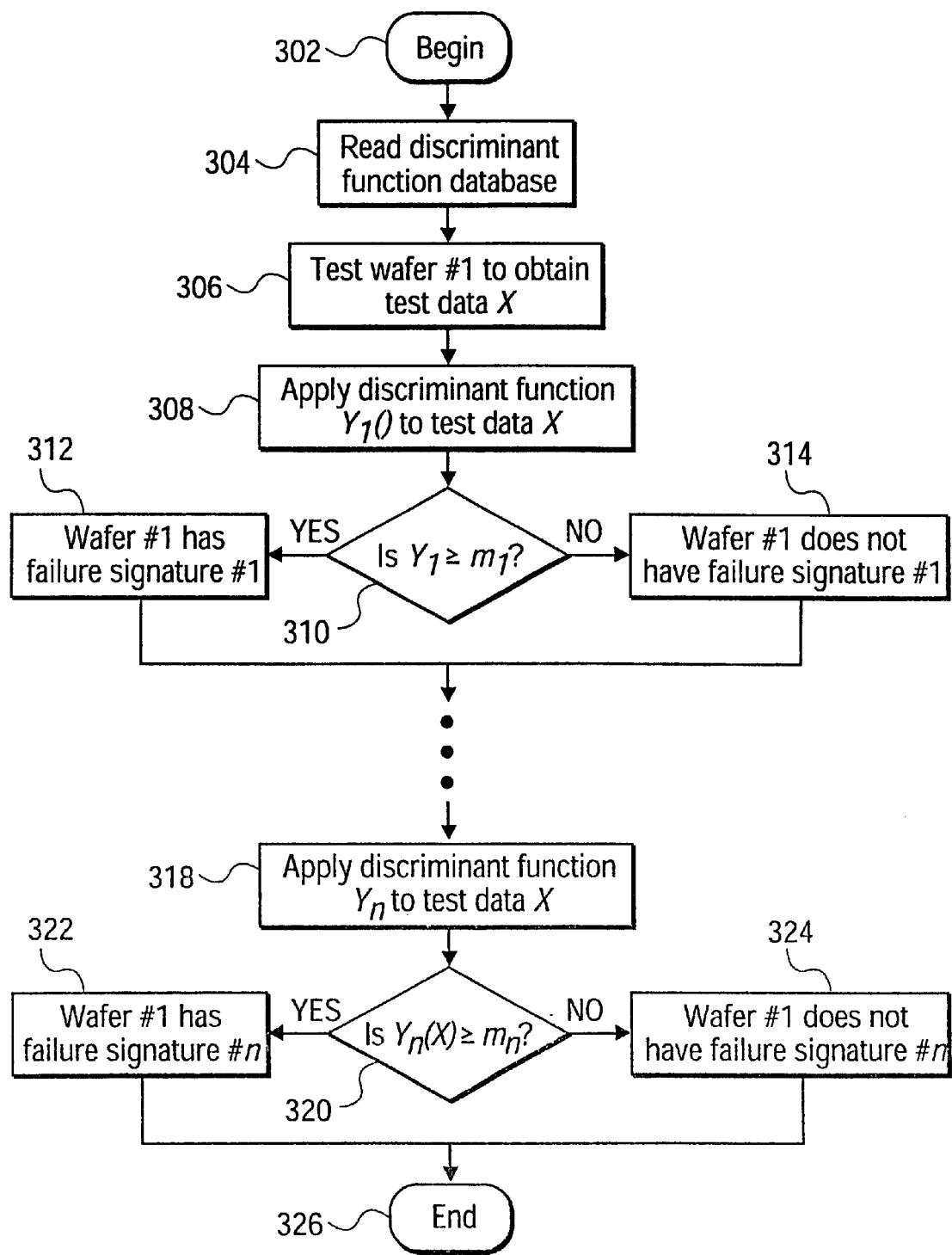
FIG. 3 is a flow diagram of a process for determining whether a wafer has certain failure signatures.

Next, turning to FIG. 3, process flow 300 is used to determine the classification of a wafer manufactured after the discriminant functions $Y_1$ to $Y_n$ have been established. Process 300 begins in box 302. In box 304, the coefficients of the discriminant functions are read from a database. In box 306, a set of electrical testing is applied to the wafer to obtain test data X. Test data X contains test data that are indicative of all failure signatures. Some failure signatures may not require the use of all of the test data. For example, 100 different parameters may be obtained from various tests conducted on the wafer. Each failure signature may be related to only 20 or 30 of those parameters. The test data X from box 306 is given to discriminant function $Y_1$ in box 308. The discriminant value $Y_1$ is compared with midpoint value $m_1$ in box 310. If the discriminant value $Y_1$ is greater than or equal to the midpoint value $m_1$, then the wafer has the first failure signature, box 312. If the discriminant value $Y_1$ is less than midpoint value $m_1$, then the wafer does not have the first failure signature, box 314. Next, the testing for the 2nd to the (n−1)th failure signature are applied.

In box 318, the test data X is given to the discriminant function $Y_n$ in box 318. The discriminant value $Y_n$ is compared with the midpoint value $m_n$ in box 320. If the discriminant value $Y_n$ is greater than or equal to the midpoint value $m_n$, then the wafer has the nth failure signature, box 322. If the discriminant value is less than the midpoint value $m_n$, then the wafer does not have the nth failure signature, box 324. After the last failure signature has been tested, process 300 ends in box 326.

Process 300 is used to determine whether a wafer has the first to the nth failure signatures. Likewise, a similar process is applied to the other wafers to determine whether they have the first to the nth failure signatures. Because the whole process of determining the failure signatures for the wafers can be automatically processed by testing tools coupled to a computer, an operator can easily retrieve relevant data to determine the cause of the defects in the process.

After the wafers are tested, a failure matrix can be obtained to determine the yield loss of each failure signature. An example of a failure matrix is shown in Table 2:

TABLE 2

| Wafer # | $s_1$ | $s_2$ | $s_3$ | $s_4$ | $s_5$ | ... |
|---|---|---|---|---|---|---|
| 1 | 1 | 0 | 0 | 1 | 0 | ... |
| 2 | 0 | 0 | 0 | 0 | 0 | ... |
| 3 | 0 | 0 | 0 | 1 | 0 | ... |
| 4 | 1 | 0 | 1 | 0 | 0 | ... |

The symbols "$S_1$", "$S_2$", . . . , represent different types of failure signatures. An entry in the table with the number "1" means that the wafer has the corresponding failure signature. An entry in the table with the number "0" means that the wafer does not have the corresponding failure signature. Thus in Table 2, the first wafer has failure signature $S_1$ and $S_4$. The second wafer has no failure signature; the third wafer has failure signature $S_4$, and so on.

While the preferred embodiment of the invention has been illustrated and described, it will be appreciated that various changes can be made therein without departing from the spirit and scope of the invention. For example, the embodiment is directed to classifying a wafer according to a failure signature. The embodiment can also be used to classify a wafer according to other characteristic signatures that are not related to wafer defects.

The embodiments of the invention in which an exclusive property or privilege is claimed are defined as follows:

1. A method for classifying a semiconductor wafer according to a failure signature, the method comprising the steps of:

providing a plurality of wafers having circuit patterns formed thereon;

testing each wafer of said plurality of wafers to obtain a set of training test values, said set of training test values indicative of the characteristics of the failure signature;

selecting a first group of wafers from said plurality of wafers, each wafer of said first group of wafers having the failure signature;

generating a first mean value vector from said set of training test values associated with said first group of wafers;

selecting a second group of wafers from said plurality of wafers, each wafer of said second group of wafers not having the failure signature;

generating a second mean value vector from said set of training test values associated with said second group of wafers;

generating a variance matrix from said set of training test values;

generating a set of coefficients for a discriminant function from said first mean value vector, said second mean value vector, and said variance matrix;

providing the semiconductor wafer;

testing the semiconductor wafer to obtain a set of test values;

generating a discriminant value by using said set of test values as input to said discriminant function; and identifying the semiconductor wafer as having the failure signature when said discriminant value is not less than a threshold value.

2. The method of claim 1, wherein said threshold value is representative of a midpoint value between a first mean value and a second mean value, wherein said first mean value is representative of the average of measurement values derived from said first group of wafers, and said second mean value is representative of the average of measurement values derived from said second group of wafers.

3. The method of claim 1, wherein the step of generating a set of discriminant function coefficients comprises of multiplying the difference of said first and second mean value vectors with the inverse of said variance matrix.

4. The method of claim 1, wherein said threshold value is proportional to the value $(\mu_1-\mu_2)'\cdot\Sigma^{-1}\cdot(\mu_1+\mu_2)$, where $\mu_1$ is said first mean value vector, $\mu_2$ is said second mean value vector, and $\Sigma$ is a covariance matrix derived from said set of training test values.

5. The method of claim 1, wherein the step of testing each wafer of said plurality of wafers includes testing the electrical functionality of the patterned circuitry of said plurality of wafers.

6. The method of claim 1, wherein the step of testing each wafer of said plurality of wafers includes testing the physical properties of said plurality of wafers.

7. The method of claim 1, wherein the tests used in the step of testing each wafer of said plurality of wafers and the tests used in the step of testing said semiconductor wafer are identical.

8. The method of claim 1, wherein the tests used in the step of testing each wafer of said plurality of wafers includes a threshold voltage test.

9. The method of claim 1, wherein the tests used in the step of testing each wafer of said plurality of wafers includes a metal line contact resistance test.

10. The method of claim 1, wherein the tests used in the step of testing each wafer of said plurality of wafers includes a yield rate test.

11. A method for automatically classifying a semiconductor wafer according to a characteristic defect pattern after a set of training data values has been obtained from electrical tests performed on a plurality of wafers, the method comprising the steps of:

selecting a first subset of training data values from the set of training data values associated with wafers having the characteristic defect pattern;

selecting a second subset of training data values from the set of training data values associated with wafers not having the characteristic defect pattern;

generating a set of coefficients for a discriminant function from said first subset of training data values and said second subset of training data values;

performing electrical tests on the semiconductor wafer to obtain a set of test data values;

applying said discriminant function to said set of test data values to obtain a discriminant value; and classifying the semiconductor wafer as having the characteristic defect pattern when said discriminant value is not less than a threshold value.

12. The method of claim 11, wherein the step of generating a set of coefficients for a discriminant function comprises the steps of:

generating a first mean value vector from said first subset of training data values;

generating a second mean value vector from said second subset of training data values;

generating a variance matrix from said set of training data values;

generating a coefficient vector by multiplying the difference of said first and second mean value vectors with the inverse of said variance matrix; and assigning the elements of the coefficient vector as said coefficients of said discriminant function.

13. A method for automatically identifying semiconductor wafers having a characteristic signature, the method comprising the steps of:

providing a plurality of wafers having circuit patterns formed thereon;

performing a set of tests on each wafer of said plurality of wafers to obtain a set of training data values;

applying cluster analysis to said set of training data values in order to group said plurality of wafers into a first subset of wafers having the characteristic signature and a second subset of wafers not having the characteristic signature;

selecting a first subset of training data values that are associated with said first subset of wafers;

selecting a second subset of training data values that are associated with said second subset of wafers;

generating a set of coefficients for a discriminant function using said first subset of training data values and said second subset of training data values;

providing a test wafer;

performing said set of tests on said test wafer to obtain a set of test data values;

applying said discriminant function to said set of test data values to obtain a discriminant value; and identifying said test wafer as having the characteristic signature when said discriminant value is greater than a threshold value.

14. The method of claim 13, wherein said set of tests performed on each wafer of said plurality of wafers includes electrical tests indicative of the characteristic signature.

15. A method for testing and classifying a semiconductor wafer, the method comprising the steps of:

providing a set of wafers having circuit patterns formed thereon;

testing each wafer of said set of wafers to obtain a first set of test data indicative of the existence and non-existence of a fail signature on each wafer of said set of wafers;

generating coefficients for a discriminant function from said first set of test data; and testing the semiconductor wafer to obtain a second set of test data;

applying said discriminant function to said second set of test data to obtain a discriminant value; and classifying the semiconductor wafer as associated with said failure signature when said discriminant value is greater than a threshold value.

16. A method for classifying a semiconductor wafer according to a failure signature, the method comprising the steps of:

providing a plurality of wafers having circuit patterns formed thereon;

testing each wafer of said plurality of wafers to obtain a set of training data, said set of training data indicative of the characteristics of the failure signature;

selecting a first group of wafers from said plurality of wafers, each wafer of said first group of wafers having the failure signature;

selecting a first subset of training data associated with said first group of wafers from said set of training data;

selecting a second group of wafers from said plurality of wafers, each wafer of said second group of wafers not having the failure signature;

selecting a second subset of training data associated with said second group of wafers from said set of training data;

generating a discriminant function from said first and second subset of training data, said discriminant function used to receive a set of data as input and produce a discriminant value as output;

providing a test wafer;

testing said test wafer to obtain a set of test data;

generating a discriminant value from said discriminant function using said set of test data as input to said discriminant function; and identifying said test wafer as having the failure signature when said discriminant value is greater than a threshold value.

17. A method for testing and classifying a semiconductor wafer according to a failure signature, the method comprising the steps of:

providing a plurality of wafers having circuit patterns formed thereon;

testing each wafer of said plurality of wafers to obtain a first set of test data for each wafer, said first set of test data having a first subset of test data being associated with the failure signature, and a second subset of test data not associated with the failure signature;

generating coefficients for a discriminant function from said first and second subsets of test data;

testing the semiconductor wafer to obtain a second set of test data;

generating a discriminant value using said discriminant function with said second set of test data as input to said discriminant function; and classifying the semiconductor wafer as associated with the failure signature when said discriminant value is above or equal to a threshold value, and classifying the semiconductor wafer as not associated with the failure signature when said discriminant value is below said threshold value.

18. The method of claim 17, wherein the step of generating coefficients for a discriminant function comprises the steps of:

generating a first mean value vector from said first subset of test data;

generating a second mean value vector from said second subset of test data;

generating a variance matrix from said first set of test data; and generating the coefficients of the discriminant function from said first mean value vector, said second mean value vector, and said variance matrix.

19. The method of claim 18, wherein said threshold value is representative of a midpoint value between a first mean value and a second mean value, wherein said first mean value is an average of discriminant values derived from said first subset of test data, and said second mean value is an average of discriminant values derived from said second subset of test data.

20. A method for classifying a semiconductor wafer according to a failure signature in accordance with a discriminant function, the coefficients of the discriminant function being generated from a first set of training data associated with wafers having the failure signature and a second set of training data associated with wafers not having the failure signature, the method comprising the steps of:

providing the semiconductor wafer;

testing the semiconductor wafer to obtain a set of test data;

generating a discriminant value from the discriminant function using said set of test data as input to the discriminant function; and identifying the semiconductor wafer as having the failure signature when said discriminant value is greater than a threshold value.

* * * * *